(12) United States Patent
Kenney et al.

(10) Patent No.: US 8,948,332 B2
(45) Date of Patent: Feb. 3, 2015

(54) METHOD OF STATIC PHASE OFFSET CORRECTION FOR A LINEAR PHASE DETECTOR

(71) Applicants: John Kenney, West Windsor, NJ (US); Jeremy Z. Walker, Mountain View, CA (US)

(72) Inventors: John Kenney, West Windsor, NJ (US); Jeremy Z. Walker, Mountain View, CA (US)

(73) Assignee: Analog Devices, Inc., Norwood, MA (US)

( * ) Notice: Subject to any disclaimer, the term of this patent is extended or adjusted under 35 U.S.C. 154(b) by 113 days.

(21) Appl. No.: 13/679,884

(22) Filed: Nov. 16, 2012

(65) Prior Publication Data

US 2014/0139266 A1  May 22, 2014

(51) Int. Cl.
*H03D 3/24* (2006.01)
*H03L 7/07* (2006.01)
*G01R 25/00* (2006.01)

(52) U.S. Cl.
CPC .............. *H03L 7/07* (2013.01); *G01R 25/005* (2013.01)
USPC ....................................... 375/373

(58) Field of Classification Search
CPC ..... H04L 7/033; H04L 7/0025; H04L 7/0331; H04L 7/0337; H04L 7/002; H03L 7/0814; H03L 7/087; H03L 7/091; H03L 7/06; H03L 7/0998; H03L 7/18; H03L 7/089

USPC .............. 375/226, 371, 373, 375–376; 327/9, 327/144, 147, 155–156
See application file for complete search history.

(56) References Cited

U.S. PATENT DOCUMENTS

| | | | |
|---|---|---|---|
| 7,283,601 B2 * | 10/2007 | Tamura et al. | 375/373 |
| 2006/0002497 A1 * | 1/2006 | Zhang | 375/355 |
| 2008/0303568 A1 * | 12/2008 | Werner et al. | 327/158 |
| 2010/0119024 A1 * | 5/2010 | Shumarayev et al. | 375/371 |
| 2013/0216014 A1 * | 8/2013 | Kong et al. | 375/376 |

OTHER PUBLICATIONS

Savoj et al., "A 10-Gb/s CMOS Clock and Data Recovery Circuit with a Half-Rate Linear Phase Detector", IEEE Journal of Solid-State Circuits, vol. 36, No. 5, pp. 761-768, May 2001.
Rennie et al., "A 5-Gb/s CDR Circuit with Automatically Calibrated Linear Phase Detector", IEEE Transactions on Circuits and Systems (Regular Papers), vol. 55, No. 3, pp. 796-803, Apr. 2008.

* cited by examiner

*Primary Examiner* — Khanh C Tran
(74) *Attorney, Agent, or Firm* — Kenyon & Kenyon, LLP

(57) ABSTRACT

A method for calibrating a clock and data recovery circuit may include configuring a phase detector as a bang-bang phase detector. The bang-bang phase detector may be used to determine a phase difference between a sampling clock provided by an interpolator and a calibration signal. The phase detector may also be configured as a linear phase detector. While using the linear phase detector, a linear phase detector parameter may be adjusted such that the phase difference between the calibration signal and the sampling clock is zero, while keeping the phase of the sampling clock fixed.

28 Claims, 6 Drawing Sheets

METHOD OF STATIC PHASE OFFSET CORRECTION FOR A LINEAR PHASE DETECTOR

BACKGROUND

A clock and data recovery (CDR) circuit can be used to recover information from a stream of data when the data is received without an accompanying clock. The CDR circuit can include a clock recovery circuit to provide a clock that is aligned to the data. Optimal sampling of the data to recover information from the data can be performed when the clock is correctly aligned to the data.

The CDR circuit may employ a negative feedback loop (e.g., phase lock loop) to generate a clock whose phase is aligned to the phase of the data. The negative feedback loop may include a phase detector, a loop filter and a phase adjuster (e.g., voltage controlled oscillator). The phase detector may receive a clock (e.g., sampling clock) and a data stream as inputs and output a signal representing a phase difference (e.g., phase error) between the clock and the data. The loop filter may process the signal representing the phase difference and provide a filtered signal to the phase adjuster. The phase adjuster may use the filtered signal to adjust the clock to align the phase of the clock to the phase of the data.

The phase detector can be a linear phase detector or a bang-bang phase detector (e.g., non-linear phase detector or binary phase detector). Linear phase detectors generate outputs that have a linear (or proportional) relationship to phase differences at the inputs. As the magnitude of the phase difference changes, the magnitude of the linear phase detector output changes proportionally. The output of a linear phase detector will be zero when the clock and the data are synchronized. Bang-bang phase detectors generate outputs that have a step function relationship to a phase difference at their inputs. Thus, bang-bang phase detectors merely provide a positive or a negative pulse indicating whether the phase of the clock is leading or lagging the phase of the data and do not provide information about the magnitude of the phase difference at the inputs. The output of a bang-bang detector will alternate between a positive and a negative signal when the clock and the data are phase aligned.

Because each of these phase detectors have their advantages and disadvantages, they are used based on the performance requirements of the application. Linear phase detectors sometimes are preferred over bang-bang phase detectors because linear phase detectors generate less charge pump activity and have lower ripple on the CDR circuit resulting in less timing jitter. However, due to the finite gain of the linear phase detectors, any dc offset errors that are injected at the output of the linear phase detector will be reflected back to the input as constant (static) phase errors between the clock and the data. The presence of this static phase error between the clock and the data can lead to a sub-optimal sampling point for the data in the CDR circuit. As a result, the presence of the static phase error can degrade performance when the input data has significant jitter (i.e., phase movement).

The static phase error may be due to a delay caused by one or more of the components in the phase detector. Calibration can be used to improve the performance of a linear phase detector by correcting for the static phase error caused by the linear phase detector. The static phase error caused by the linear phase detector may be compensated for by changing a parameter of the linear phase detector or a parameter of the CDR circuit (e.g., adding an offset value to the phase detector output). Existing calibration methods do not always provide accurate results and can involve using complex circuits to perform the calibration process. These circuits include many components which are only used for the calibration and are not utilized when the clock is aligned with the data stream.

The inventors have identified a need in the art for a simple method and circuit that can be used to calibrate the phase detector and/or the CDR circuit to correct for the static phase error.

BRIEF DESCRIPTION OF THE DRAWINGS

So that features of the present invention can be understood, a number of drawings are described below. It is to be noted, however, that the appended drawings illustrate only particular embodiments of the invention and are therefore not to be considered limiting of its scope, for the invention may encompass other equally effective embodiments.

DETAILED DESCRIPTION

Embodiments of the present invention provide circuits and techniques for calibrating a phase detector and/or a CDR circuit by configuring the phase detector as a bang-bang phase detector and also configuring the phase detector as a linear phase detector. A phase detector that includes 6 latches can be configured to serve the dual-purpose of a linear phase detector and a bang-bang phase detector. The bang-bang phase detector may determine a phase relationship between a sampling clock generated by an interpolator and a calibration clock (e.g., reference clock). This relationship can be used to provide a sampling clock which is kept at constant phase in the CDR circuit, while a parameter in the linear phase detector is adjusted to produce an output of zero from the linear phase detector. After calibration, the linear phase detector with the adjusted parameter may be used to generate a clock that is aligned with the data sequence.

Figure 1:
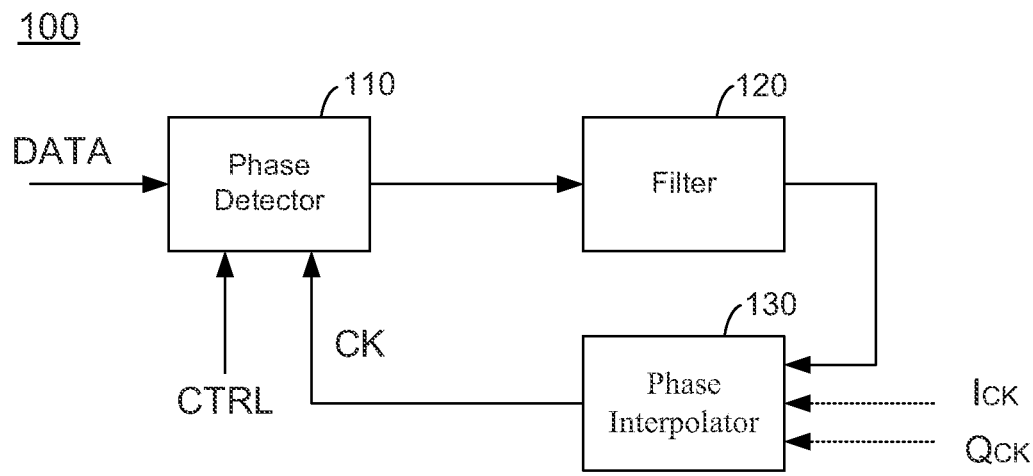
FIG. 1 is a block diagram of a CDR circuit according to an embodiment of the present invention.

FIG. 1 is a block diagram of a CDR circuit 100 according to an embodiment of the present invention. The CDR circuit 100 may include a phase detector 110, a filter 120 and a phase interpolator 130. The phase detector 110 may include a linear phase detector and a bang-bang phase detector. The phase detector 110 may receive a sampling clock and a data stream and output a signal representing a phase difference between the sampling clock and the data. In the case of a linear phase detector, the output (e.g., current or voltage) may have a magnitude that changes proportionally with the magnitude of the phase difference. In the case of a bang-bang phase detector, the output may be a positive or a negative pulse indicating whether the phase of the sampling clock is leading or lagging the phase of the data. The filter 120 may process the output of the phase detector 110 and provide a filtered signal to the phase interpolator 130. The phase interpolator 130 may use the filtered signal to generate and/or adjust the sampling clock to align the phase of the sampling clock to the phase of the data.

Calibration of the CDR circuit 100 and/or the phase detector 110 may include using the bang-bang phase detector and subsequently the linear phase detector in the phase detector 110. During operation of the CDR circuit, the phase detector 110 may use only the linear phase detector. The calibration may include determining a value of a parameter of the linear phase detector that will compensate for the phase error caused by the linear phase detector. During operation of the CDR circuit 100, the calibration results can be used to provide a control signal CTRL to the phase detector 110 to compensate for the static phase error.

Figure 2:
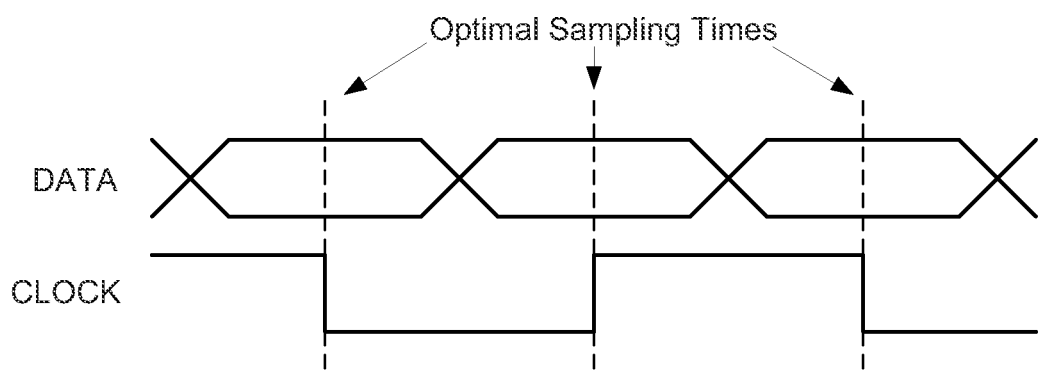
FIG. 2 is a timing diagram illustrating an ideal half-rate sampling of incoming data.

The linear phase detector may be a half-rate linear phase detector. The half-rate linear phase detector may be based on a design by Savoj et. al., "A 10-Gb/s CMOS clock and data recovery circuit with a half-rate linear phase detector", IEEE J. Solid-State Circuits, vol. 36, pp. 761-768 2001. The linear phase detector may use both phases of the sampling clock CK to sample the incoming data (e.g., sample the incoming data at twice the sampling clock CK rate). The linear phase detector may use latches to generate the information about phase difference between the sampling clock CK and the data. When the phase difference between the sampling clock CK and the data is zero (i.e., output of the linear phase detector is zero), the edges of the clock CK will line up with the eye of the data. FIG. 2 is a timing diagram illustrating an ideal half-rate sampling of incoming data. As shown in FIG. 2, the up and down edges of the clock CK line up with the eye of the data DATA when the phase difference between the sampling clock CK and the data is zero.

The bang-bang phase detector may be a full-rate bang-bang phase detector. The bang-bang phase detector may include the linear phase detector (e.g., two sets of cascaded latches) and additional latches (e.g., two additional latches).

The filter 120 may be an integrator. The filter 120 may include a digital to analog converter (DAC) to convert a digital output from the phase detector 110 into an analog signal for the phase interpolator 130. The filter 120 may be an integrator, a lag/lead network, or an integrator combined with either a lead network or a lead/lag network. The filter 120 may include a second integrator to compensate for frequency offset during operation of the CDR circuit 100.

The phase interpolator 130 may generate a clock CK (i.e., sampling clock) based on the received signal from the filter 120. The phase interpolator 130 may adjust the phase of a reference clock using the signal from the filter 120. The phase interpolator 130 may be a voltage controlled or a current controlled interpolator. The phase interpolator 130 may receive in-phase clock ($I_{CK}$) and quadrature clock ($Q_{CK}$) (i.e., reference clock) and perform a weighted sum to produce a phase shifted output to align the clock CK to the data. The in-phase clock ($I_{CK}$) and the quadrature clock ($Q_{CK}$) may be produced outside of the CDR circuit 100. The in-phase clock ($I_{CK}$) and quadrature clock ($Q_{CK}$) do not have to be aligned with the clock CK of the CDR circuit 100 and do not have to have the same frequency as the frequency of the data.

Figure 3:
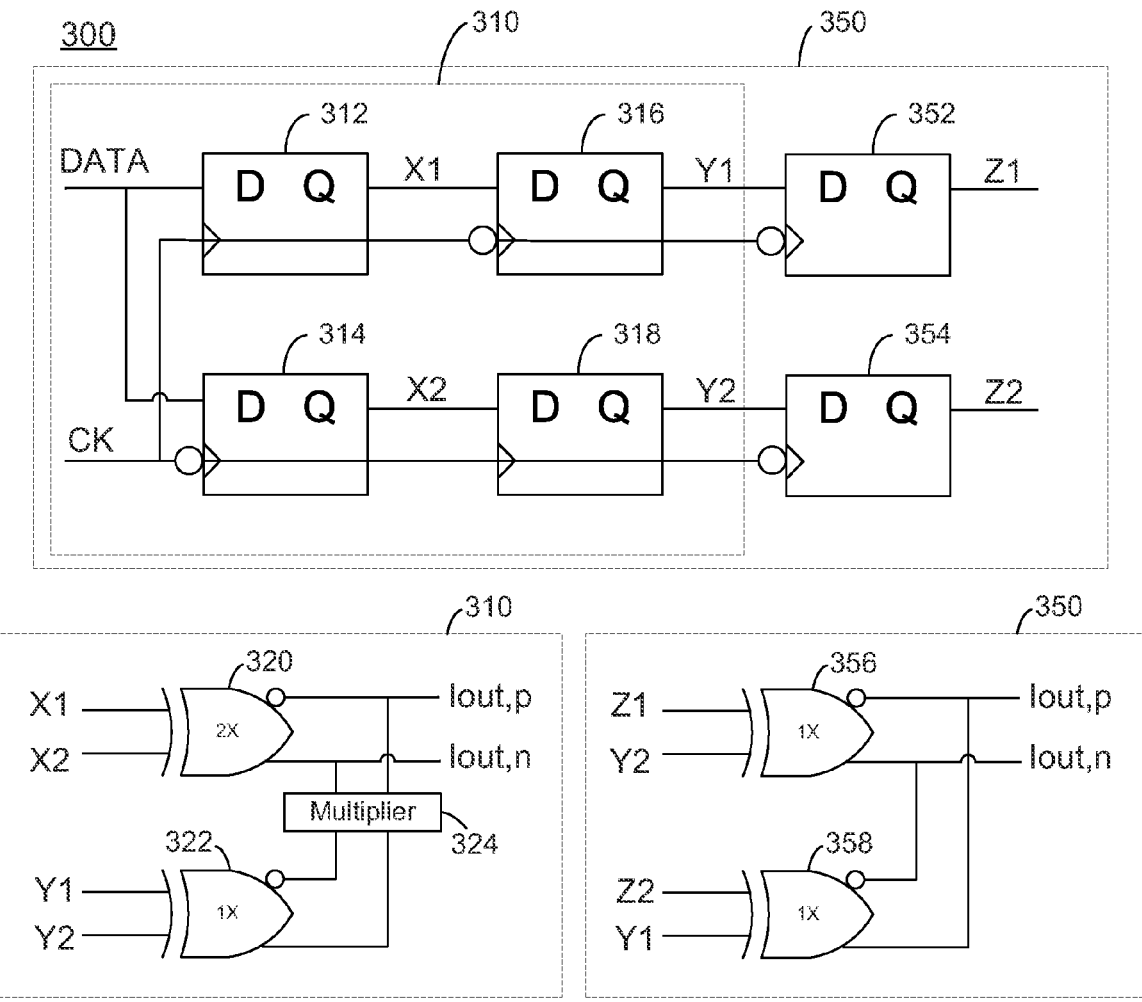
FIG. 3 illustrates a phase detector including a linear phase detector and a bang-bang phase detector according to an embodiment of the present invention.

FIG. 3 illustrates a phase detector 300 according to an embodiment of the present invention. The phase detector 300 may include a linear phase detector 310 and a bang-bang phase detector 350. The linear phase detector may include latches 312, 314, 316 and 318, and XOR gates 320 and 322. The bang-bang phase detector 350 may include the linear phase detector 310, latches 352 and 354, and XOR gates 356 and 358. Nodes between the latches may be coupled to the inputs of the XOR gates such that the intermediate signals X1, X2, Y1 and Y2 are provided to the inputs of XOR gates 320 and 322 and the intermediate signals Y1, Y2, Z1 and Z2 are provided to the inputs of XOR gates 356 and 358 (connections not shown in FIG. 3 for simplicity). The linear phase detector 310 and the bang-bang phase detector 350 may be used to calibrate the CDR circuit and the linear phase detector 310 may be used during operation of the CDR loop.

The linear phase detector 310 may receive as inputs data DATA and the clock CK and provide outputs $I_{OUT,P}$ and $I_{OUT,N}$ representative of the phase difference between the inputs. DATA and the clock CK may be provided to the inputs of the latches 312 and 314. The first set of latches 312 and 314 may be used to provide the clock to data phase information represented by signals X1 and X2.

Figure 4:
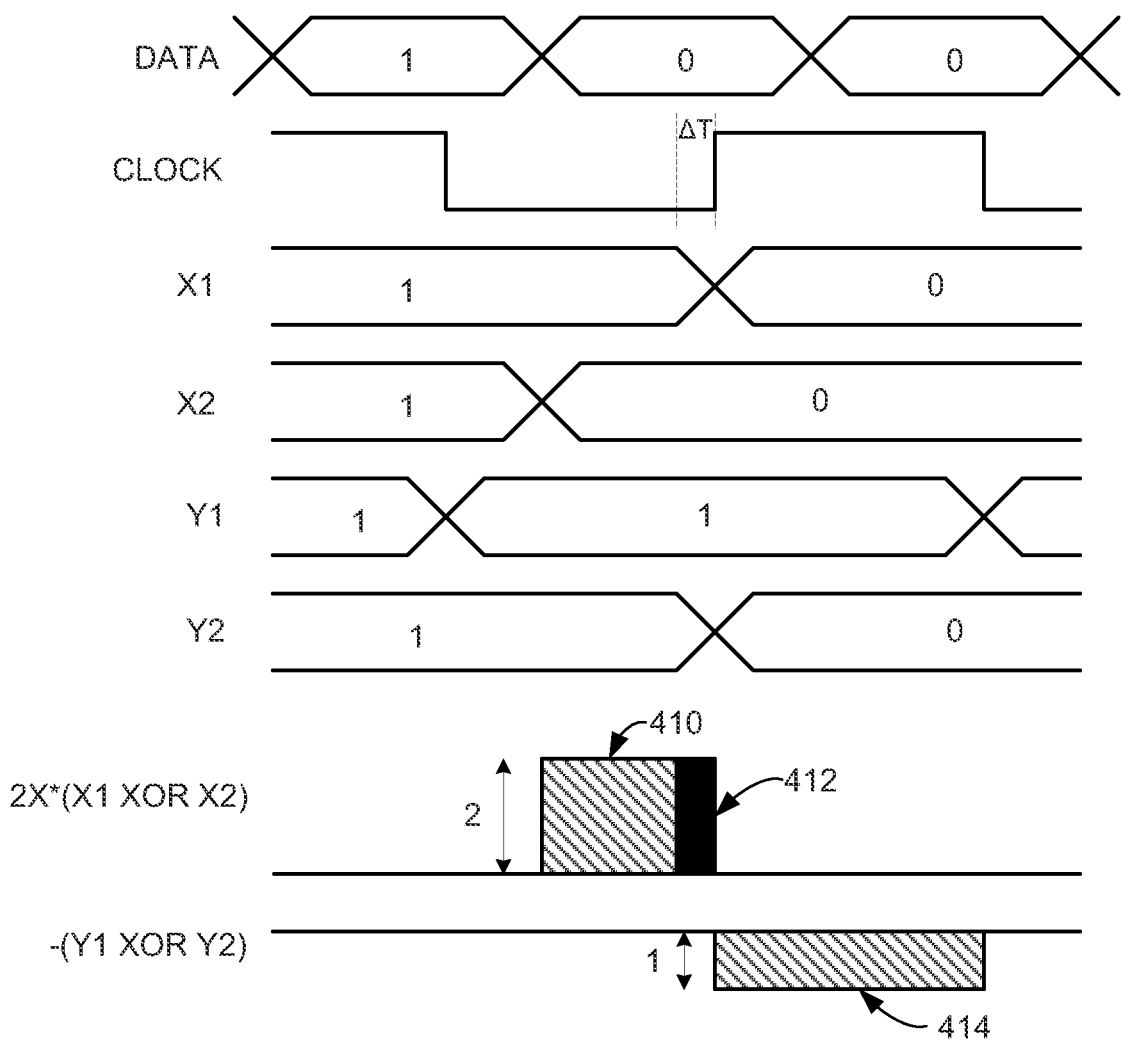
FIG. 4 illustrates exemplary signals of a half-rate linear phase detector according to an embodiment of the present invention.

FIG. 4 illustrates exemplary signals of a half-rate linear phase detector according to an embodiment of the present invention. As shown in FIG. 4, if the rising edge of the clock CK follows the input data DATA, signal X1 will have an edge determined by the clock edge while signal X2 will have an edge determined by the data transition time. Providing intermediate signals X1 and X2 to the XOR gate 320 will provide a true (i.e., "2") output when one, and only one of the signals X1 or X2 is true (i.e., "1"). The output of the XOR gate 320 will result in a "2" whose width is equal to half a bit period 410 plus the phase error ΔT 412.

The second set of latches 316 and 318 may provide a reference pulse 414 (i.e., cancellation pulse). Signals Y1 and Y2 from latches 316 and 318 may be provided to the XOR gate 322 to provide a reference pulse having a fixed-width pulse of one bit. The fixed-width pulse helps to avoid pattern jitter by removing the fixed term (i.e., half a bit period) provided by the XOR gate 320 using signals X1 and X2.

Because the output of the XOR gate 320 is only half as wide as the output of the XOR gate 322, the amplitude of the output of the XOR gate 320 may be scaled up by a factor of two with respect to the output of the XOR gate 322. Thus, the difference between the outputs of the XOR gates 320 and 322 will be equal to zero when the clock transitions are in the middle of the eye of the data (as shown in FIG. 2).

The linear phase detector 310 may include a multiplier 324. The multiplier 324 may be used to adjust the output of the XOR gate 322 such that the output of the linear phase detector 310 is zero during calibration. For example, the multiplier 324 may be used to adjust the output such that the output of the multiplier 324 may equal the output of the XOR gate 320. The value for the multiplier 324 may also be used to adjust for the static phase offset during the operation of the CDR circuit to track the phase of a data sequence.

The bang-bang phase detector 350 may receive as inputs data DATA and the clock CK and provide outputs $I_{OUT,P}$ and $I_{OUT,N}$ representative of the phase difference between the inputs. The linear phase detector 310, a third set of latches 352 and 354 and XOR gates 356 and 358 provide a full-rate bang-bang phase detector 350. The full-rate bang-bang phase detector 350 may be used for calibration. The calibration may include determining the static phase offset such that the compensation can be made for the static phase offset in the linear phase detector 310. The XOR gate 356 may receive signals Z1 and Y2 and provide an early pulse (e.g., positive pulse).

The XOR gate 358 may receive signals Z2 and Y1 and provide a late pulse (e.g., negative pulse).

Differential outputs $I_{OUT,P}$ and $I_{OUT,N}$ representative of the phase difference between the inputs from the linear phase detector 320 and the bang-bang phase detector 350 may be provided to a multiplexor (not shown) to select which output will be provided to the filter. During calibration a control signal may be provided to the multiplexer to first provide the output of the bang-bang phase detector 350 to the filter and then the output of the linear phase detector 310 to the filter in the CDR circuit. During operation of the CDR circuit to track the phase of a data sequence, the control signal may be provided to the multiplexer to provide the output of the linear phase detector 310 to the filter in the CDR circuit.

Figure 5:
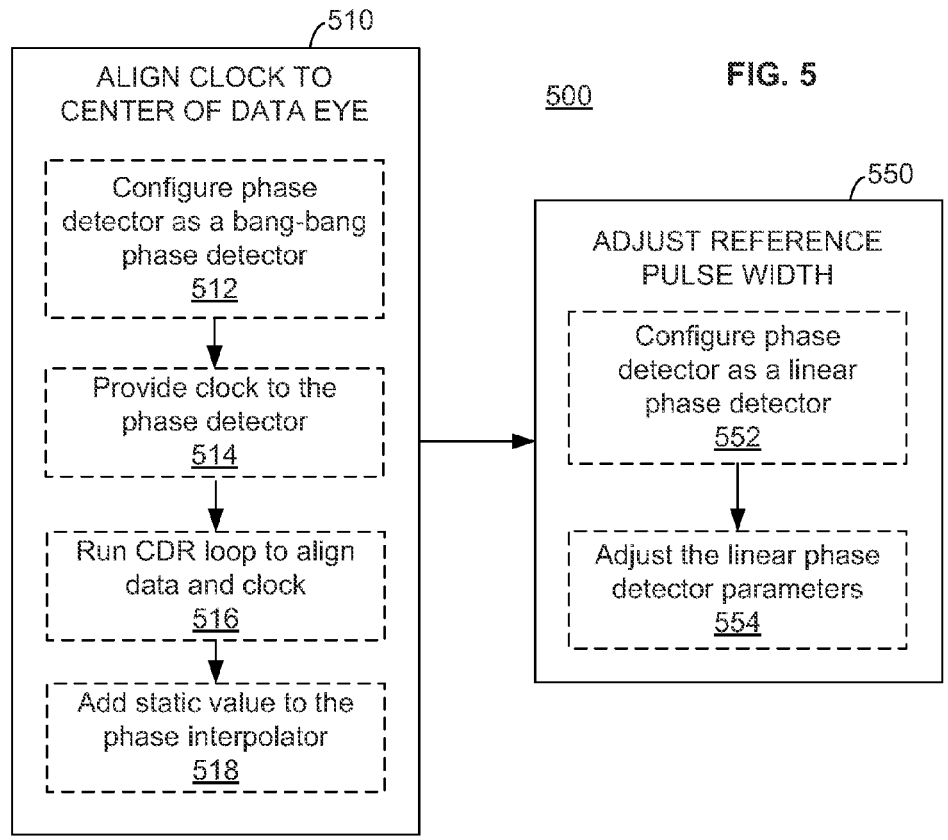
FIG. 5 illustrates a method for calibrating the CDR circuit according to an embodiment of the present invention.

FIG. 5 illustrates a method 500 for calibrating the CDR circuit according to an embodiment of the present invention. The method 500 for calibrating the CDR circuit may include aligning a clock to the center of a data eye (box 510) and adjusting the reference pulse width (box 550). The method may be performed on a CDR circuit having a phase detector shown in FIG. 3. Aligning the clock to the center of a data eye (box 510) may include using a bang-bang phase detector. Adjusting the reference pulse width (box 550) may include using a linear phase detector.

Aligning the clock to the center of the data eye (box 510) may include configuring the phase detector as a bang-bang phase detector (box 512). Using the phase detector shown in FIG. 3, the outputs of the XOR gates 356 and 358 may be used to provide early and late pulses, respectively. Aligning the clock to the center of the data eye (box 510) may be performed by generating a reference clock. The reference clock may be used as an input to the phase detector in place of the data (box 514). The data provided to the phase detector may be a clock signal with a frequency that is equal to half of the reference clock of the sampling clock provided by the interpolator. The reference clock may be the in-phase clock ($I_{CK}$) which is also provided to the phase interpolator.

The CDR circuit with the bang-bang phase detector may be operated (box 516) to align the data provided to the phase detector with the clock generated by the phase interpolator. The CDR circuit may be operated to adjust the clock such that the falling edges of the clock are aligned with the rising and falling edges of the data (i.e., edges of the signal having a frequency that is equal to half of the reference clock).

Once the data provided to the bang-bang phase detector is aligned with the clock generated by the phase interpolator, a static value can be added to the phase interpolator (box 518) to offset the sampling clock by a fixed time period. The fixed time period may be approximately equal to one half of the bit period of the clock generated by the phase interpolator (e.g., 50 ps for a 10 Gb/s signal). Adding the static value to the phase interpolator allows the phase interpolator to operate as a delay line to offset the clock.

Adjusting the reference pulse width (box 550) may include configuring the phase detector as a linear phase detector (box 552) and adjust a parameter of the linear phase detector parameters (box 554). Configuring the phase detector as a linear phase detector (box 552) may include reconfiguring the bang-bang phase detector as a linear phase detector. Configuring the phase detector as a linear phase detector (box 552) may include using the first two sets of latches, shown in FIG. 3, for the linear phase detector.

Adjusting the linear phase detector parameters (box 554) may include adjusting the linear phase detector parameters such that the average output of the linear phase detector is zero. The parameters of the linear phase detector may be adjusted while leaving the input to the phase interpolator fixed. The phase interpolator may receive a value corresponding to the static value determined while implementing the bang-bang phase detector. The reference pulse, generated by XOR gate 322 in FIG. 3, may be weighted until the average output of the linear phase detector is zero.

In another embodiment, the linear phase detector may be adjusted by adding a static value (digital or analog) to the output of the linear phase detector. The analog signal can be added to the output of the linear phase detector in order to make the average output of the linear phase detector zero during calibration. The digital signal can be added to the output of the linear phase detector if the negative feedback loop is implemented digitally. The feedback loop can be implemented digitally by converting the average output of the linear phase detector to the digital domain by an analog-to-digital converter.

In another embodiment, the amplitude of the error pulse may be adjusted until the average output of the linear phase detector is zero. Adjusting the amplitude of the error pulse may correct for the static phase offset but will also adjust the bandwidth of the CDR circuit.

Figure 6:
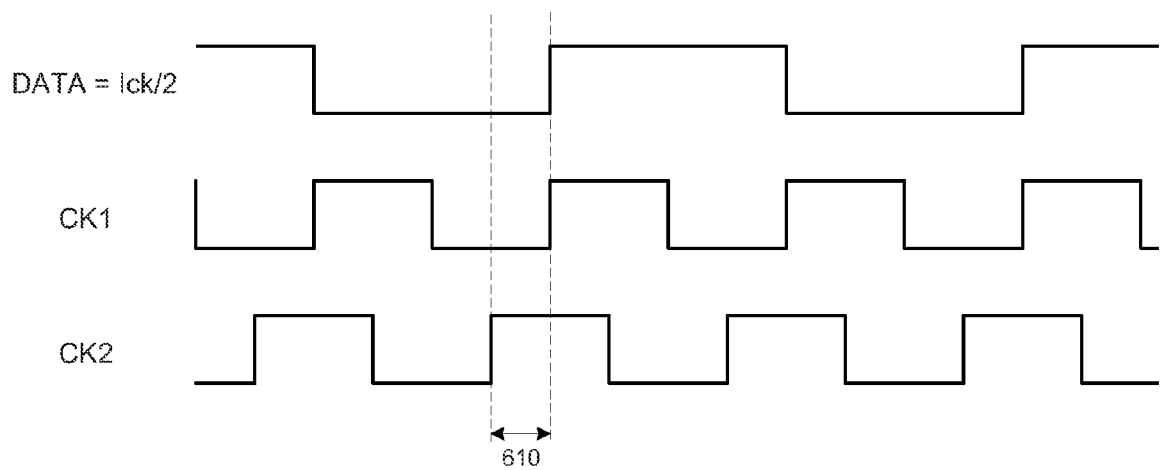
FIG. 6 is a timing diagram illustrating signals that are provided to the phase detector.

FIG. 6 is a timing diagram illustrating signals that are provided to the phase detector. The input data DATA provided to the phase detector can be one half the in-phase clock ($I_{CK}$). The sampling clock CK1 having a frequency that is twice the frequency of the input data DATA, is first provided to the phase detector to align the data DATA to the sampling clock CK1. Once the data is aligned, a static value is added to the phase interpolator to offset the sampling clock CK2 by a fixed time period 610. As shown in FIG. 6, the sampling clock CK2 is offset by one half of the bit period of the clock CK1 generated by the phase interpolator.

The fixed time period 610 for the offset is not limited to being one half of the bit period of the clock generated by the phase interpolator but may be any predetermined value. When the phase interpolator is offset by one half of the bit period of the clock generated by the phase interpolator, the output of the linear phase detector should be zero. If the phase interpolator is offset by something other than one half of the bit period of the clock generated by the phase interpolator, the average output of the linear phase detector may increase or decrease depending on the linear phase detector gain. Because the gain of the phase detector is known and the average output of the linear phase detector has a linear relationship with the phase difference at its inputs, the output of the linear phase detector for an offset having a predetermined value may be known. For example, if the gain of the linear phase detector is 1 mV/ps, the bit period is 100 ps, and the offset of the phase interpolator is 75 ps, the average output of the linear phase detector may be 25 mV (1 mV/ps*[75 ps−50 ps]). With such an offset, the calibration may be performed to adjust the linear phase detector until the average output of the linear phase detector is 25 mV. Thus, the calibration methods and circuits of this disclosure may be modified to include a predetermined value to offset the sampling clock.

Figure 7:
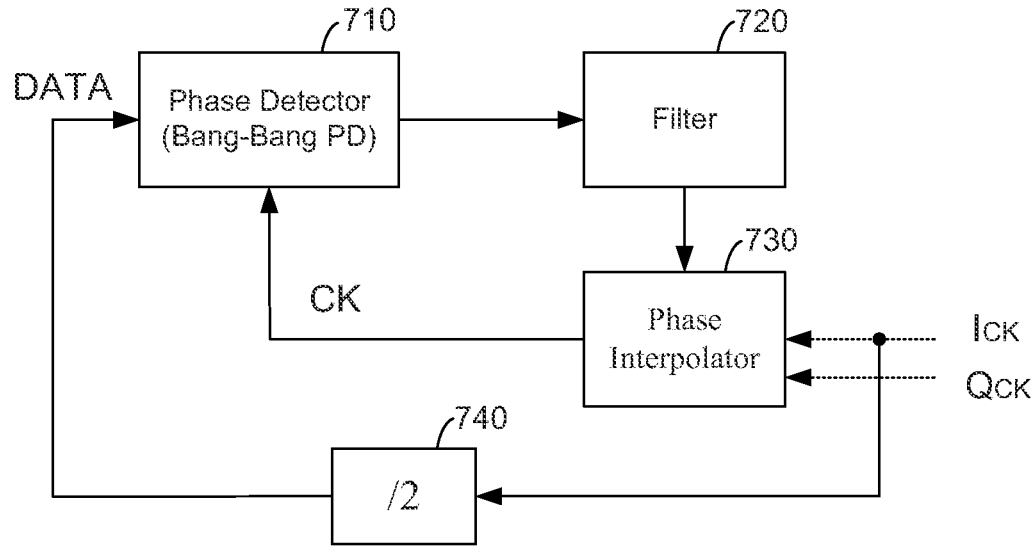
FIG. 7 illustrates operation of a CDR circuit with a bang-bang phase detector according to one embodiment of the present invention.

FIG. 7 illustrates operation of a CDR circuit 700 with a bang-bang phase detector according to one embodiment of the present invention. During calibration, the CDR circuit 700 may align the data provided to the bang-bang phase detector 710 with the clock generated by the phase interpolator 730. The filter 720, which may be an integrator, may filter the output (e.g., current or voltage pulse) provided by the bang-bang phase detector 710 and use the filtered signal to drive the phase interpolator 730. The phase interpolator 730 may generate a clock CK based on the received filtered signal from filter 720. The phase interpolator may receive in-phase clock ($I_{CK}$) and quadrature clock ($Q_{CK}$) and perform a weighted sum to produce a phase shifted output of the clock CK. The in-phase clock ($I_{CK}$) may be divided by divider 740 to provide data to the bang-bang phase detector that is equal to one half of the clock produced by the phase interpolator 730 (e.g., 2.5 GHz for 5 GHz clock).

Figure 8:
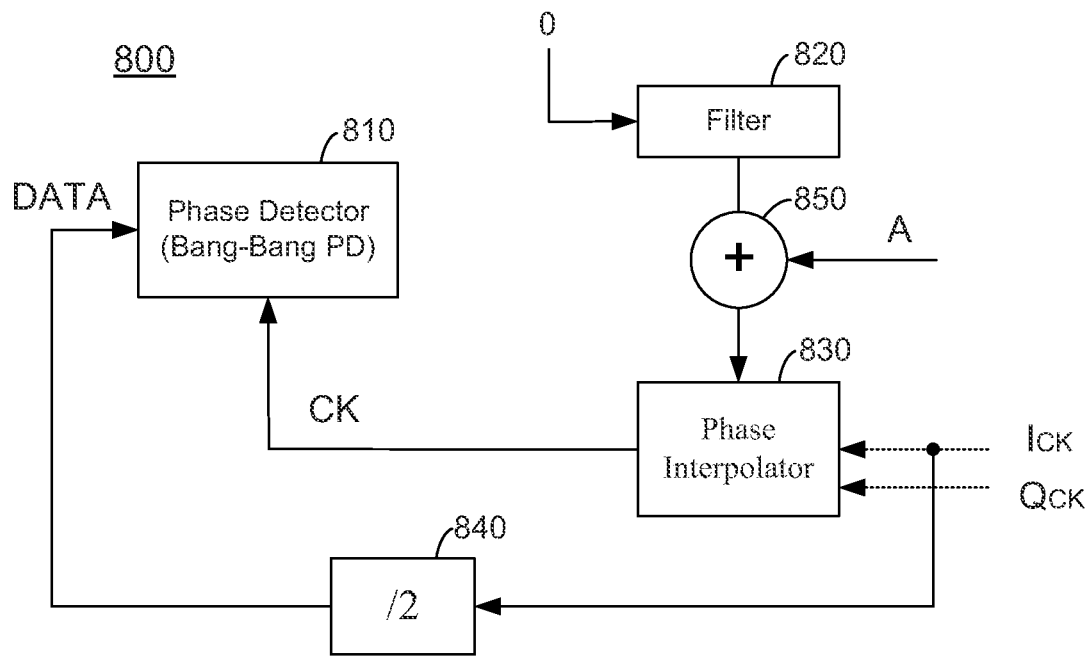
FIG. 8 illustrates operation of a CDR circuit with a bang-bang phase detector according to another embodiment of the present invention.

FIG. 8 illustrates operation of a CDR circuit 800 with a bang-bang phase detector according to another embodiment of the present invention. During calibration, the CDR circuit 800 may offset the clock by a fixed time period. The CDR circuit 800 illustrates a static value A being added by adder 850 to the phase interpolator 830. Because the data is already aligned to the clock generated by the phase interpolator 830, the output of the bang-bang phase detector 810 is zero. Thus, the input into the filter 820 is set to zero and the phase interpolator 830 receives only the static value A. The phase interpolator 830 may use the static value A to offset the clock CK by a fixed time period which may be approximately equal to one half of the bit period of the clock determined using the circuit shown in FIG. 7.

Figure 9:
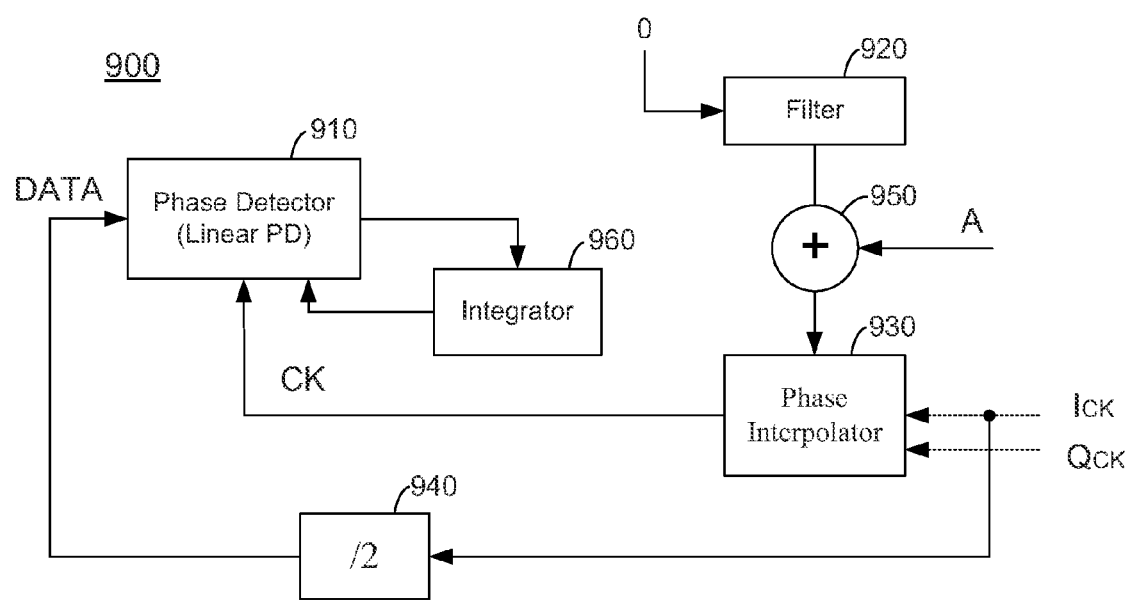
FIG. 9 illustrates operation of a CDR circuit with a linear phase detector according to an embodiment of the present invention.

FIG. 9 illustrates operation of a CDR circuit 900 with a linear phase detector according to an embodiment of the present invention. The CDR circuit 900 includes the linear phase detector 910 to adjust the parameter of the linear phase detector 910 such that the average output of the linear phase detector 910 is zero. The input to the phase interpolator 930 may be kept constant, by providing a zero input to the filter 920 and providing a static value A to the phase interpolator 930 via adder 950. The static value A may be determined while implementing the bang-bang phase detector shown in FIGS. 7 and 8. Adjusting the linear phase detector parameters may include using integrator 960 to adjust the weighting of the output (e.g., the reference pulse) generated by XOR gate receiving signals Y1 and Y2.

The CDR circuits 700, 800 and 900 shown in FIGS. 7, 8 and 9, respectively, may all be part of the same CDR circuit. The CDR circuits 700, 800 and 900 are provided by selecting the outputs of the linear phase detector or the bang-bang phase detector shown in the phase detector of FIG. 3.

As discussed above, the in-phase clock ($I_{CK}$) may be divided by divider 740, 840 or 940 to provide a calibration clock to the CDR circuit. In another embodiment, a bit pattern may be used as the calibration clock. The bit pattern may include a 50% transition density (e.g., transitions occur 50% of the time, on average) and a symbol rate that is equal to the sampling clock frequency. The bit pattern may be a pseudo-random binary sequence (PRBS) pattern. The PRBS pattern may have a symbol rate that is equal to the sampling clock frequency in the CDR circuit. For example, the PRBS pattern may have a symbol rate of 5 Gb/s for a 5 GHz sampling clock in the CDR circuit. Using other bit patterns may involve more implementation complexity than a simple clock.

In the above description, for purposes of explanation, numerous specific details have been set forth in order to provide a thorough understanding of the inventive concepts. As part of this description, some structures and devices may have been shown in block diagram form in order to avoid obscuring the invention. Reference in the specification to "one embodiment" or "an embodiment" means that a particular feature, structure, or characteristic described in connection with the embodiment is included in at least one embodiment of the invention, and multiple references to "one embodiment" or "an embodiment" should not be understood as necessarily all referring to the same embodiment.

Although the methods illustrated and described herein include series of steps, it will be appreciated that the different embodiments of the present disclosure are not limited by the illustrated ordering of steps, as some steps may occur in different orders, some concurrently with other steps apart from that shown and described herein. In addition, not all illustrated steps may be required to implement a methodology in accordance with the present invention. Moreover, it will be appreciated that the processes may be implemented in association with the apparatus and systems illustrated and described herein as well as in association with other systems not illustrated.

It will be appreciated that in the development of any actual implementation (as in any development project), numerous decisions must be made to achieve the developers' specific goals (e.g., compliance with system and business related constraints), and that these goals will vary from one implementation to another. It will also be appreciated that such development efforts might be complex and time consuming, but would nevertheless be a routine undertaking for those of ordinary skill in the art having the benefit of this disclosure.

It is to be understood that the above description is intended to be illustrative, and not restrictive. For example, the above described embodiments may be used in combination with each other. Many other embodiments will be apparent to those of skill in the art upon reviewing the above description. The scope of the invention therefore should be determined with reference to the appended claims, along with the full scope of equivalents to which such claims are entitled.

We claim:

1. A method for calibrating a clock and data recovery circuit, comprising:
    in a first mode of operation, determining phase differences between edges of a sampling clock and a calibration signal, the phase differences represented as positive or negative pulses generated by a phase detector;
    in the first mode of operation, adjusting the phase of the sampling clock to align the sampling clock to the calibration signal;
    in a second mode of operation, determining phase differences between edges of the sampling clock and the calibration signal, the phase differences represented by width of pulses generated by the phase detector;
    in the second mode of operation, adjusting a parameter of the phase detector such that the phase difference between the calibration signal and the sampling clock is zero, while keeping the phase of the sampling clock fixed.

2. The method of claim 1, wherein the sampling clock is provided by an interpolator and the method further comprising adding a static value to the interpolator to offset the sampling clock output by the interpolator.

3. The method of claim 2, wherein the static value offsets the sampling clock by a time period equal to one-quarter of the sampling clock period.

4. The method of claim 2, wherein the static value is added to the interpolator in the second mode of operation.

5. The method of claim 1, wherein in the first mode of operation the phase detector is configured as a bang-bang phase detector and in the second mode of operation the phase detector is configured as a linear phase detector.

6. The method of claim 1, further comprises running the clock and data recovery circuit in the first mode of operation until the edges of the sampling clock are aligned with the edges of the calibration signal, wherein a frequency of the calibration signal is half of a frequency of the sampling clock.

7. The method of claim 6, further comprising adding a static value to the interpolator to offset the sampling clock.

8. The method of claim 1, wherein adjusting the parameter of the phase detector includes adding a static value to the output of the phase detector such that the average output of the phase detector is a predetermined value.

9. The method of claim 1, wherein adjusting the parameter of the phase detector includes adjusting the parameter of the phase detector such that the average output of the phase detector is zero.

10. The method of claim 1, wherein adjusting the parameter of the phase detector includes weighting a reference pulse of the phase detector such that the average output of the phase detector is zero.

11. A clock and data recovery circuit, comprising:
a phase detector that includes a bang-bang phase detector and a linear phase detector, the phase detector receives a data signal and a sampling clock and outputs an error signal corresponding to a phase difference between the sampling clock and the data signal;
a filter for smoothing the error signal output by the phase detector;
an interpolator that generates the sampling clock by adjusting a reference clock provided to the interpolator based on the filtered error signal; and
a divider for dividing the reference clock and providing the divided reference clock to the phase detector as the data signal during calibration.

12. The clock and data recovery circuit of claim 11, wherein the bang-bang phase detector determines a phase difference between a sampling clock and the divided reference clock.

13. The clock and data recovery circuit of claim 11, wherein the error signal output by the bang-bang phase detector is filtered and provided to the interpolator to adjust the sampling clock such that the falling edges of the sampling clock are aligned with the rising and falling edges of the divided reference clock.

14. The clock and data recovery circuit of claim 11, further comprises an adder for adding a static value to the interpolator to offset the sampling clock generated by the interpolator.

15. The clock and data recovery circuit of claim 14, wherein the static value offsets the sampling clock by a time period equal to one quarter of the sampling clock period.

16. The clock and data recovery circuit of claim 14, wherein the linear phase detector is calibrated by adjusting a linear phase detector parameter, such that the phase difference between the divided reference clock and the sampling clock is zero, while keeping the phase of the sampling clock fixed using the static value supplied to the interpolator.

17. The clock and data recovery circuit of claim 16, wherein the linear phase detector generates the error signal corresponding to the phase difference between the sampling clock and a stream of data after calibration.

18. The clock and data recovery circuit of claim 16, wherein adjusting the linear phase detector parameter includes weighting a reference pulse of the linear phase detector such that the average output of the phase detector is zero.

19. The clock and data recovery circuit of claim 16, wherein adjusting the linear phase detector parameter includes adjusting the parameter of the phase detector such that the average output of the phase detector is zero.

20. The clock and data recovery circuit of claim 11, wherein the bang-bang phase detector and the linear phase detectors are used consecutively to calibrate the clock and data recovery circuit and the linear phase detector is used to generate the sampling clock for a stream data using the calibration results.

21. A phase detector for a clock and data recovery circuit comprising:
a linear phase detector including a first set of latches, a second set of latches, and a first set of XOR gates that receive outputs from the first set of latches and the second set of latches, at least one of the XOR gates includes a multiplier for adjusting the output of the linear phase detector during calibration, while the phase of a sampling clock provided to the linear phase detector is kept fixed; and
a bang-bang phase detector that includes the first set of latches, the second set of latches, a third set of latches, and a second set of XOR gates that receive output from the second set of latches and the third set of latches, wherein the outputs of the second set of XOR gates provide pulses indicating a phase difference between a calibration clock and the sampling clock provided to the inputs of the bang phase detector.

22. A method for calibrating a clock and data recovery circuit, comprising:
in a first mode of operation, determining phase differences between edges of a sampling clock and a bit pattern, the phase differences represented as positive or negative pulses generated by a phase detector;
in the first mode of operation, adjusting the phase of the sampling clock to align the sampling clock to the bit pattern;
in a second mode of operation, determining phase differences between edges of the sampling clock and the bit pattern, the phase differences represented by width of pulses generated by the phase detector; and
in the second mode of operation, adjusting a parameter of the phase detector such that the phase difference between the bit pattern and the sampling clock is a predetermined phase difference value, while keeping the phase of the sampling clock fixed.

23. The method of claim 22, wherein predetermined phase difference value is zero.

24. The method of claim 22, wherein the bit pattern includes a fifty percent transition density and a symbol rate that is equal to a sampling clock frequency.

25. The method of claim 22, wherein the bit pattern is a pseudo-random binary sequence pattern with a symbol rate that is equal to a sampling clock frequency.

26. The method of claim 22, wherein the sampling clock is provided by an interpolator and the method further comprising adding a predetermined static value to the interpolator to offset the sampling clock.

27. The method of claim 22, wherein adjusting the parameter of the phase detector includes adjusting the parameter of the phase detector such that the average output of the phase detector is a predetermined value.

28. The method of claim 22, wherein adjusting the parameter of the phase detector includes adjusting the parameter of the phase detector such that the average output of the phase detector is zero.

* * * * *